(12) United States Patent  
Park et al.

(10) Patent No.: US 7,520,933 B2
(45) Date of Patent: Apr. 21, 2009

(54) METHOD FOR MANUFACTURING COLLOIDAL CRYSTALS VIA CONFINED CONVECTIVE ASSEMBLY

(75) Inventors: O-Ok Park, Seoul (KR); Mun-Ho Kim, Gyeongsangbuk-Do (KR); Sang-Hyuk Im, Gyeongsangbuk-Do (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 300 days.

(21) Appl. No.: 11/512,413

(22) Filed: Aug. 30, 2006

(65) Prior Publication Data

US 2008/0053369 A1    Mar. 6, 2008

(51) Int. Cl.
C30B 7/04    (2006.01)
(52) U.S. Cl. .............................. 117/68; 117/69; 117/70
(58) Field of Classification Search .................. 117/68, 117/69, 70, 939
See application file for complete search history.

(56) References Cited

U.S. PATENT DOCUMENTS

2006/0120683 A1*    6/2006    Kamp et al. ................. 385/141

OTHER PUBLICATIONS

West et al., Colloidal particles at a nematic-isotropic interface: Effects of confinement, Eur. Phys. J. E 20 2006 pp. 237-242.*
Dimitrov, A.S. and Nagayama, K., "Continuous Convective Assembling of Fine Particles into Two-Dimensional Arrays on Solid Surfaces," Langmuir 12:1303-1311, American Chemical Society (1996).
Van Duffel, B., et al., "Langmuir-Blodgett deposition and optical diffraction of two-dimensional opal," J. Mater. Chem. 11:3333-3336, RSC Publishing (2001).
Haynes, C.L. and Van Duyne, R.P., "Nanosphere Lithography: A Versatile Nanofabrication Tool for Studies of Size-Dependent Nanoparticle Optics," J. Phys. Chem. 105:5599-5611, American Chemical Society (2001).
Jiang, P., et al., "Single-Crystal Colloidal Multilayers of Controlled Thickness," Chem. Mater. 11:2132-2140, American Chemical Society (1999).
Míguez, H., et al., "Control of the Photonic Crystal Properties of fcc-Packed Submicrometer $SiO_2$ Spheres by Sintering," Adv. Mater. 10:480-483, Wiley-VCH Verlag GmbH & Co. KGaA (1998).

(Continued)

Primary Examiner—Robert M Kunemund
(74) Attorney, Agent, or Firm—Sterne, Kessler, Goldstein & Fox P.L.L.C.

(57) ABSTRACT

Disclosed is a method of manufacturing colloidal crystals using a confined convective assembly, more particularly, to a method for manufacturing two-dimensional and/or three dimensional colloidal crystals on a substrate by infusing colloidal suspension between two substrates and self-assembling colloidal particles by capillary action. The present invention can control a convective flow moving the colloidal particles to a meniscus generated by removing the solvent of the colloidal suspension. It is possible to manufacture face-to-face two-dimensional colloidal crystals and/or three-dimensional colloidal crystals within a short time using various sizes of colloidal particles through the control of the convective flow of colloidal particles, which are not easily achieved in the existing method. The present invention can use two-dimensional colloidal crystals and/or three-dimensional colloidal crystals manufactured using the confined convective assembly method in the various fields such as in biosensors and devices, information storing medium, display devices and optical devices.

18 Claims, 13 Drawing Sheets

OTHER PUBLICATIONS

Rogach, A.L., et al., "Electrophoretic Deposition of Latex-Based 3D Colloidal Photonic Crystals: A Technique for Rapid Production of High-Quality Opals," *Chem. Mater.* 12:2721-2726, American Chemical Society (2000).

* cited by examiner

METHOD FOR MANUFACTURING COLLOIDAL CRYSTALS VIA CONFINED CONVECTIVE ASSEMBLY

BACKGROUND OF THE INVENTION

1. Field of the Invention

The present invention relates, generally, to methods of manufacturing colloidal crystals using a confined convective assembly, more particularly, to a method for manufacturing two-dimensional and/or three dimensional colloidal crystals on a substrate by infusing colloidal suspension between two substrates and self-assembling colloidal particles by capillary action.

The method of manufacturing colloidal crystals according to the present invention comprises: infusing colloidal suspension in a fine space between two substrates; removing a solvent in the colloidal suspension and moving one side of the substrate to form a meniscus in the fine space between two substrates; and self-assembling colloidal particles by the capillary action generated due to the removal of the solvent of the colloidal suspension in the meniscus to form a colloidal crystal on a substrate.

2. Description of the Related Art

There are various methods to manufacture colloidal crystals such as a spin coating method (R. P. van Duyne, et al., J. Phys. Chem. B. 105, 5599(2001)), LB (Langmuir-Blodgett) (B. van Duffel, et al., J. Mater. Chem. 11. 3333 (2001)), a gravitational sedimentation (H. Miguez, et al., Adv. Mater. 10, 480 (1998)), a convective assembly (K. Nagayama et al., Langmuir 12, 1303 (1996) & P. Jiang et al. Chem. Mater. 11, 2132 (1999)) and an electrophoretic deposition (A. L. Rogach, et al., Chem. Mater. 12, 2721 (2000)).

The spin coating method, which is a widely known two-dimensional colloid crystal manufacturing method, uses a phenomenon that colloidal suspension is placed on a substrate and colloidal particles are self-assembled by a centrifugal force while water is evaporated at the time of spin coating. This method is economical in that a relatively small amount of colloid suspension is used. However, this method is disadvantageous in that it is easily used to silica nano particles with a relatively large concentration and cannot make a uniform two-dimensional colloid crystal on a large area.

LB (Langmuir-Blodgett) method uses a method in which a LB film of a solutizer including colloidal particles is made in an interface between water and air and then the colloidal particles are self-assembled when the solutizer is evaporated. In this method, a two-dimensional colloid crystal can be produced on a relatively large area, but the colloidal particle surface must be chemically modified and the colloidal crystal formed at the interface between water and the air must be moved into a substrate, again.

A gravitational sedimentation, the first known crystal manufacturing method, uses a method in which a solution where high molecular particles and silica nanoparticles are dispersed lasts for a long time and then the particles are precipitated by gravity and self-assembled. The gravitational sedimentation is known as a relatively easy method but disadvantageous in that it requires a long time to manufacture the colloidal crystals and a flawless uniform colloidal crystal can not be made on a large area.

A convective assembly method uses a method in which a solution friendly substrate is vertically placed in a solution where high molecule and silica colloidal particles are dispersed and the solution is distorted on the substrate surface by an interfacial tension and then the colloidal particles are arranged on the distorted surface to form crystals on a substrate when a solvent is completely evaporated. This method is advantageous in that a uniform three-dimensional colloidal crystal is obtained on a relatively large area but disadvantageous in that only limited sizes of the particles can be used and a relatively long time is required.

In addition, an electrophoretic deposition for manufacturing a colloid crystal on an electrode using electric fields in which surface charged nano particle is placed has been suggested. This method is advantageous in that colloidal crystals can be stacked for a short time but is inappropriate for manufacturing flawless colloidal crystals.

SUMMARY OF THE INVENTION

The present invention is directed to a method of manufacturing colloidal crystals, the method comprising: infusing a colloidal suspension comprising colloidal particles and a solvent in a fine space between two substrates; removing the solvent in the colloidal suspension and moving one of the substrates to form a meniscus in the fine space between two substrates; and self-assembling the colloidal particles by capillary action generated due to the removal of the solvent of the colloidal suspension in the meniscus to form a colloidal crystal on one of the substrates.

In some embodiments, at least one of the substrates is selected from the group consisting of a glass substrate, a silicon substrate, an aluminum substrate, a silica substrate, a gold substrate, a polystyrene substrate, a polyester substrate, a polydimethylsiloxane (PDMS) substrate, and a substrate including colloidal crystals.

In some embodiments, the substrate on which a colloidal crystal is formed can obtain multilayered colloidal crystals by applying a substrate including colloidal crystals formed from at least one selected from the group consisting of a high molecular particle, metal particle and inorganic particle.

In some embodiments, the fine space between the two substrates has a thickness of 10-100 μm.

In some embodiments, the colloidal suspension comprises at least one colloidal particle selected from the group consisting of a high molecular particle, inorganic particle, and metal particle. In some embodiments, the colloidal particles of the colloidal suspension have a diameter of 0.01-10 μm.

In some embodiments, the solvent in the colloidal suspension is at least one selected from the group consisting of water, alcohol having 1-10 carbons, aliphatic solutizer, and aromatic solutizer.

In some embodiments, the concentration of the colloidal particle in the colloidal suspension is 0.1-20% (w/v).

In some embodiments, the moving substrate moves at a speed of 1-1000 μm/s.

In some embodiments, the solvent in the colloidal suspension is removed by (a) supplying the colloidal suspension with warm air to evaporate the solvent in the colloidal suspension, (b) supplying the colloidal suspension with high temperature vapors to evaporate the solvent in the colloidal suspension, (c) evaporating the solvent in the colloidal suspension using a heating equipment, or (d) putting equipment required for manufacturing a colloid including a substrate in a chamber wherein temperature and humidity are controlled.

In some embodiments, the method further comprises filling in the pores of self-assembled colloid particles with at least one selected from the group consisting of semiconductor, metal, metal oxide, organic and organic derivatives.

In some embodiments, the high molecular particle is at least one selected from the group consisting of polystyrene, polymethylmethacrylate, polyacrylate, polyalphamethylstyrene, polyphenylmethacrylate, polydiphenylmethacrylate, polycyclohexylmethacrylate, styrene-acrylonitrile (SAN) copolymer and styrene-methylmethacrylate copolymer.

In some embodiments, the metal particle is at least one selected from the group consisting of gold, silver, aluminum, platinum, titanium, cadmium, and iron.

In some embodiments, the inorganic particle is at least one selected from the group consisting of $SiO_2$, $TiO_2$, $ZrO_2$, NiO, and $SnO_2$.

In some embodiments, the semiconductor is at least one selected from Si, CdS, CdSe, GaAs, GaAlAs, ZnS, and Ge.

In some embodiments, the metal is at least one selected from the group consisting of gold, silver, aluminum, platinum, titanium, cadmium, and iron.

In some embodiments, the metal oxide is at least one selected from the group consisting of aluminum oxide, iron oxide, zinc oxide, magnesium oxide, and antimony oxide.

In some embodiments, the organic or organic derivative is at least one selected from the group consisting of poly(paraphenylene vinylene), polythiophene, poly(para-phenylene), polyquinoline, polypyrrole, polyacetylene, polyfluorenes, polydimethylsiloxane (PDMS), and polyurethane.

BRIEF DESCRIPTION OF THE DRAWINGS

The above and other objects, features and advantages of the present invention will be more clearly understood from the following detailed description taken in conjunction with the accompanying drawings..

DESCRIPTION OF THE PREFERRED EMBODIMENTS

Figure 1:
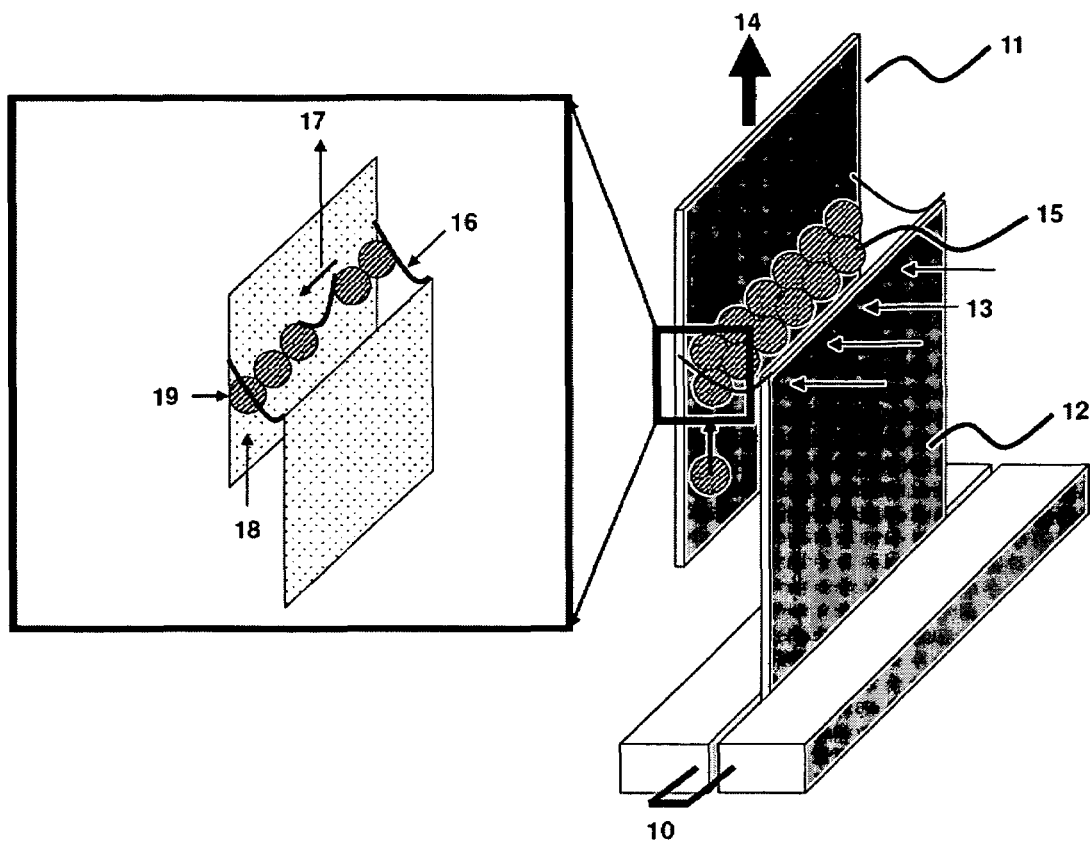
FIG. 1 is a scheme of experimental equipment for manufacturing colloidal crystals according to the present invention.

The present invention is directed to a method of manufacturing a colloidal crystal using a confined convective assembly, the method comprising: infusing colloidal suspension in a fine space between two substrates; removing a solvent in the colloidal suspension and moving one side of the substrate to form a meniscus in the fine space between two substrates; and self-assembling colloidal particles by the capillary action (the force of capillaries) generated due to the removal of the solvent of the colloidal suspension in the meniscus to form a colloidal crystal on a substrate.

The present invention can control a speed for removing the solvent in colloidal suspension while removing the solvent of the colloidal suspension. The present invention can control a convective flow for moving the colloidal particles to a meniscus by removing the solvent of the colloidal suspension. Unlike existing methods, it is possible to manufacture face-to-face two-dimensional and/or three-dimensional colloidal crystals within a short time using various sizes of colloidal particles through control of the convective flow of colloidal particles, which are not easily achieved in the existing method.

The present invention can use two-dimensional colloidal crystals and/or three-dimensional colloidal crystals manufactured using the confined convective assembly method in the various fields such as in biosensors and devices, information storing medium, display devices and optical devices.

According to the present invention, a substrate can be anything suitable for forming a conventional colloidal crystal. In some embodiments, a substrate is formed from one selected from the group consisting of a glass substrate, a silicon substrate, an aluminum substrate, a silica substrate, a gold substrate, a polystyrene substrate, a polyester substrate, a polydimethylsiloxane (PDMS) substrate, and a substrate including colloidal crystals.

When manufacturing a colloidal crystal using a confined convective assembly method according to the present invention, one of the two substrates is moved (the "moving substrate") and one of the substrates is stationary (the "fixed substrate"), and the colloidal particles are self-assembled on the moving substrate by the movement of the substrate and the capillary action generated by the removal of the solvent from colloidal suspension.

The moving substrate may move left/right and/or up/down with respect to the fixed substrate. It is preferable that the moving substrate moves in the up/down direction with respect to the fixed substrate in order to facilitate self-assembling of the colloidal particles while the solvent in the colloidal suspension is removed.

The removal of the solvent of the colloidal particles plays a role in promoting self-assembling colloidal particles by the capillary action generated by the removal of the solvent.

In some embodiments, removal of the solvent in the colloidal suspension is accelerated by (a) supplying the colloidal suspension with warm air to evaporate the solvent in the colloidal suspension, (b) supplying the colloidal suspension with high temperature vapors to evaporate the solvent in the colloidal suspension, (c) evaporating the solvent in the colloidal suspension using a heating equipment, or (d) putting equipment required for manufacturing a colloidal crystal including a substrate in a chamber where temperature and humidity are controlled.

In some embodiments, the warm air or high temperature vapors can have a temperature high enough to evaporate a solvent in the colloidal suspension. The temperature can be determined according to the type of solvent used in the colloidal suspension. Appropriate temperatures used for the warm air or high temperature vapors are known by those skilled in the art.

The present invention can be used to manufacture a two-dimensional colloidal crystal and/or a three-dimensional colloidal crystal on a substrate with the moving speed of an ordinary substrate which is not processed at all and the capillary action generated by the removal of the solvent in the colloidal suspension.

For example, if the moving substrate moves upwardly, the direction of a meniscus is formed on the moving substrate, resulting in forming a colloidal crystal on the moving substrate. On the contrary, if the moving substrate moves downwardly, the direction of the meniscus is formed on the fixed substrate, resulting in forming a colloidal crystal on the fixed substrate. As described above, the substrate where a colloidal crystal is formed may be controlled in accordance with the directions which substrate is moved and the direction the substrate is moved.

In some embodiments, the fine space between the two substrates is greater than the size of the colloidal particle in the colloidal suspension, allowing the colloidal suspension to be supplied between the two substrates. For instance, if the size of a colloid particle in the colloid suspension is 0.01-10 μm, the fine space between the two substrates can be 10-100 μm.

In some embodiments of the present invention, the colloidal suspension can include at least one selected from the group consisting of high molecular particles, inorganic particles, and metal particles. The solvent in the colloidal suspension is at least one selected from the group consisting of water, alcohol having 1-10 carbons, aliphatic solutizer, and aromatic solutizer.

In some embodiments, the high molecular particle is at least one selected from the group consisting of polystyrene, polymethylmethacrylate, polyacrylate, polyalphamethylstyrene, polyphenylmethacrylate, polydiphenylmethacrylate, polycyclohexylmethacrylate, styrene-acrylonitrile (SAN) copolymer, and styrene-methylmethacrylate copolymer.

In some embodiments, the metal particle is at least one selected from the group consisting of gold, silver, aluminum, platinum, titanium, cadmium, and iron.

In some embodiments, the inorganic particle is at least one selected from the group consisting of $SiO_2$, $TiO_2$, $ZrO_2$, NiO, and $SnO_2$.

In some embodiments, the aliphatic solutizer is at least one selected from the group consisting of hexane, ethylene glycole, glycerol, perfluoro 2-methyl2-pentene, chloroform, and perfluoro decaline.

In some embodiments, the aromatic solutizer can be benzene, toluene, cyclohexane, perfluorocyclohexane, chlorobenzene, xylene, or combination thereof.

In some embodiments, the shape of a meniscus formed between two substrates can be changed by altering the speed of the moving substrate. The shape of the meniscus is one factor for determining the thickness of a colloidal crystal to be manufactured, thus the thickness of the colloidal crystal to be formed can be determined by controlling the speed of the moving substrate. If the moving substrate is moved slowly, then the meniscus will have a soft shape and the colloidal crystal will be stacked in a multilayered structure. On the contrary, if the moving substrate is moved quickly, the meniscus will have a sharp shape, and the colloid crystals will be sparsely formed. Therefore, if a substrate is lifted at a proper speed, a high quality two-dimensional colloidal crystal consisting of one layer may be manufactured throughout a large area.

The moving substrate according to the present invention can move at the speed of 1-1000 μm/s, 1-100 μm/s, or 1-50 μm/s. The speed can be varied according to the purpose of the present invention.

In some embodiments, the thickness of a colloidal crystal to be manufactured can be controlled by changing the concentration of the colloid suspension. If the concentration of the colloidal suspension is high, the number of particles collected to the meniscus is increased. Therefore, the thickness of a colloidal crystal to be manufactured is increased. If the concentration of the colloidal suspension is low, the number of particles collected to the meniscus is reduced. It is known that the speed for lifting a substrate can be increased further as the concentration is increased so as to obtain a two-dimensional colloidal crystal having a single structure.

In some embodiments, the present invention uses a colloidal suspension having a concentration of 0.1-20% (w/v), 0.2-10% (w/v) or 0.5-2.5% (w/v). The concentration can, be varied according to the purpose of the present invention.

In some embodiments, multilayered colloidal crystals can be manufactured by stacking single layer colloidal crystal. In addition, different sizes of colloidal particles can be continuously stacked to manufacture a multilayered colloidal crystal having a crystal structure different from the existing crystal structure. Moreover, in cases that a substrate where a colloidal crystal is formed is used as a moving substrate, and the colloidal suspension having particles different from those formed on the moving substrate is formed, the heterogeneous colloidal crystal may be manufactured on one substrate. Furthermore, in some embodiments, a layer or a pattern of a colloidal crystal manufactured in another method and a colloidal crystal having a new structure can be manufactured on a nano-patterned substrate. In some embodiments, the substrate on which a colloidal crystal is formed can use a substrate on which a colloidal crystal including at least one particle selected out of high molecule, metal and inorganic particles.

In some embodiments, the method of the present invention can further comprise filling in the pores of self-assembled colloid particles with at least one of semiconductor, metal, metal oxide, organic or organic derivative.

In some embodiments, the semiconductor can be at least one selected from the group consisting of Si, CdS, CdSe, GaAs, GaAlAs, ZnS, and Ge.

In some embodiments, the metal can be at least one selected from the group consisting of gold, silver, aluminum, platinum, titanium, cadmium, and iron.

In some embodiments, the metal oxide can use at least one selected from the group consisting of aluminum oxide, iron oxide, zinc oxide, magnesium oxide, and antimony oxide.

In some embodiments, the organic or organic derivative is at least one selected from the group consisting of poly(paraphenylene vinylene), polythiophene, poly(para-phenylene), polyquinoline, polypyrrole, polyacetylene, polyfluorenes, polydimethylsiloxane (PDMS), and polyurethane.

A better understanding of the present invention can be obtained in light of the following examples which are set forth to illustrate, but are not to be construed to limit the present invention.

Figure 2:
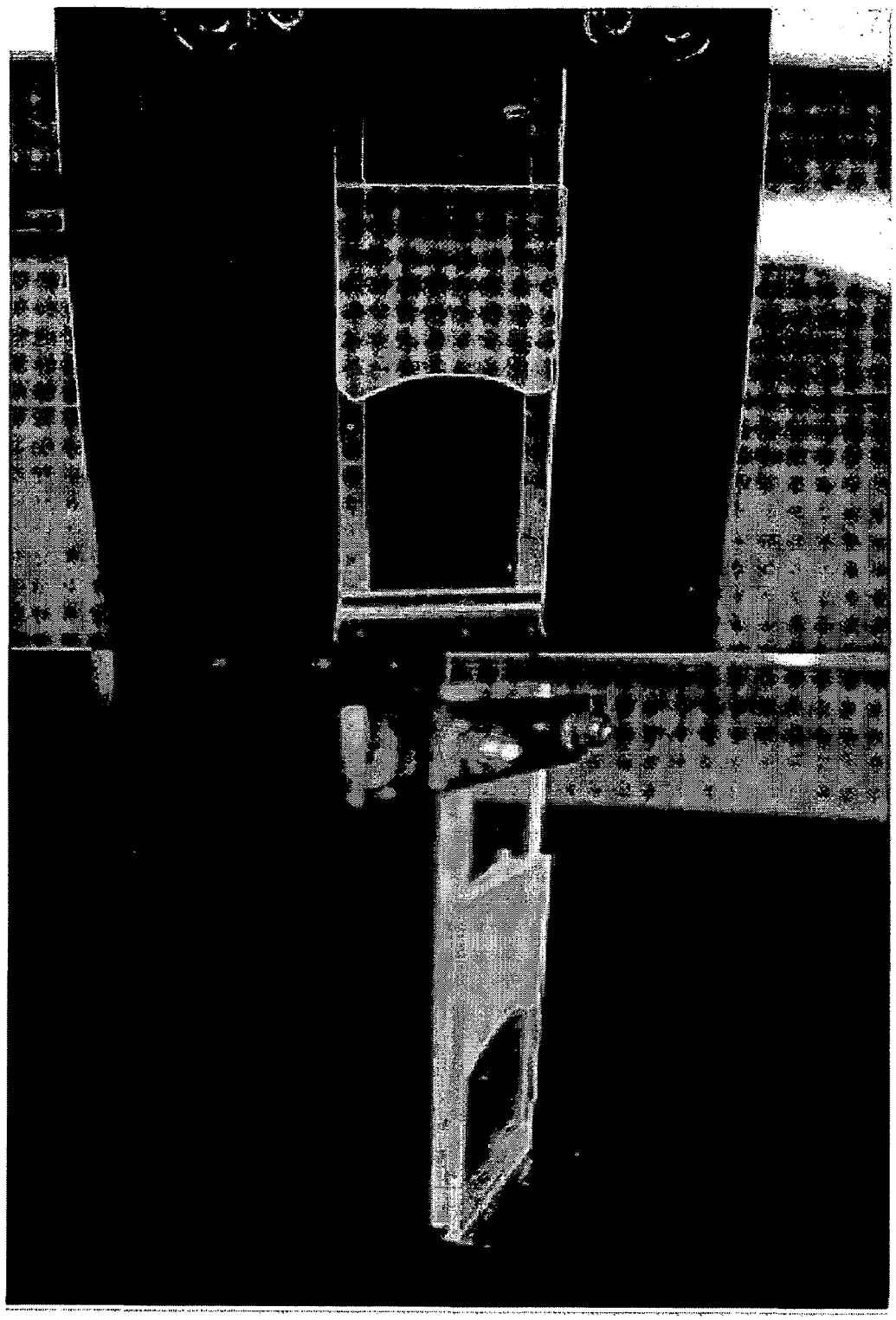
FIG. 2 is a photograph showing the front and the side of the experimental equipment for manufacturing colloidal crystals according to the present invention.
Figure 3:
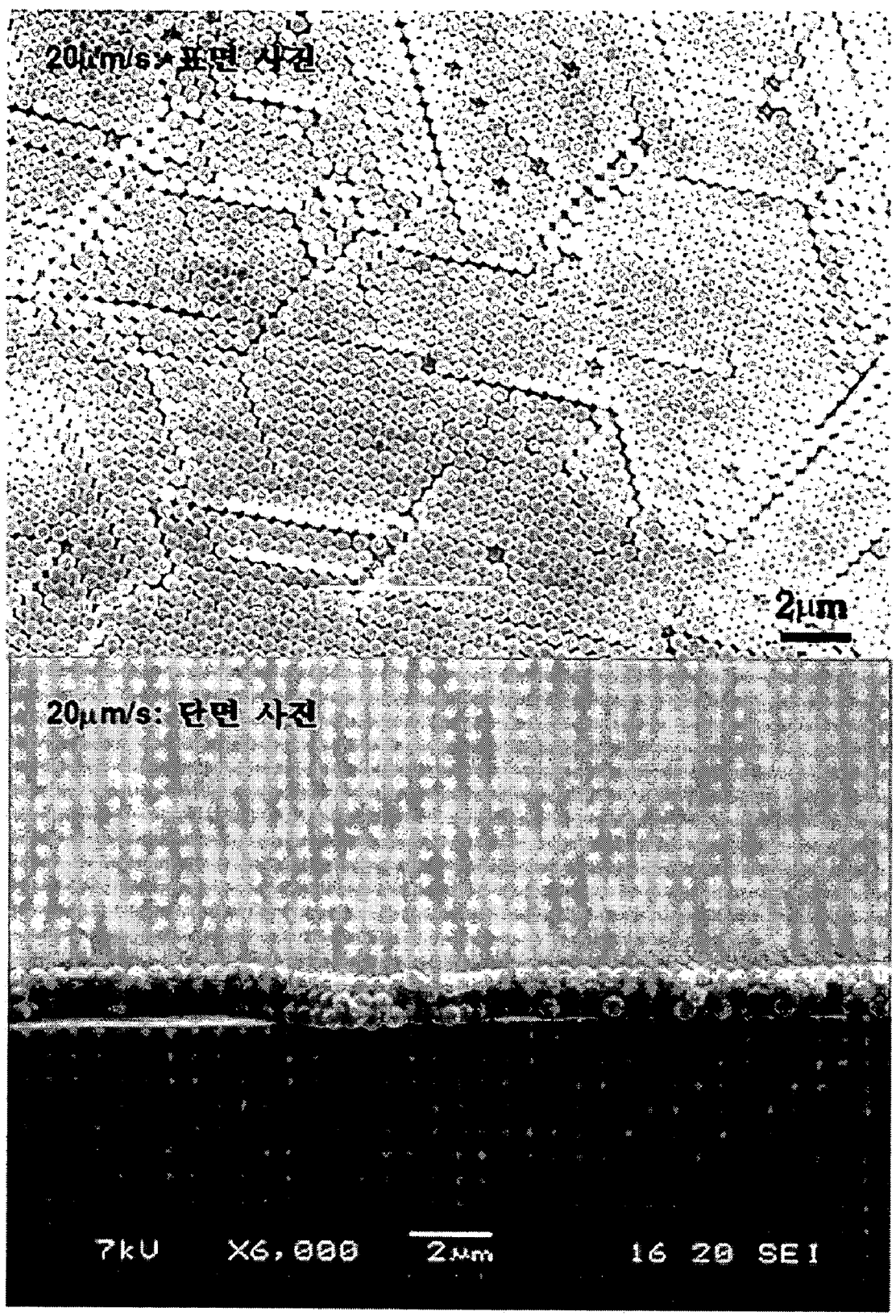
FIG. 3 is a photograph of an electron scanning microscope showing a surface and a cross-section of three-dimensional colloidal crystal of a polystyrene particle with 460 nm according to the present invention (concentration: 0.5%, speed of lifting a rear substate: 20 μm/s).

FIG. 1 is a scheme of experimental equipments for manufacturing colloidal crystals according to the present invention and FIG. 2 is a photograph showing the front and the side of the experimental equipment for manufacturing colloidal crystals according to the present invention.

As shown in FIG. 1, a colloidal suspension is infused into a fine space (100 μm thick) between the two substrates, a moving substrate (11) and a fixed substrate (12). Warm air (13) is applied, and the moving substrate (11) is lifted at a regular speed (14). Then, a meniscus (16) of colloidal suspension occurs between two substrates and the solvent of the colloidal suspension on the meniscus is evaporated quickly by the warm air. The colloidal particles are self-assembled on the rear substrate (11) by the lateral capillary force (17) generated from the vaporization of the solvent.

In FIG. 1, numeral 10 refers to a fixing fin for fixing a fixing plate on which two substrates are placed, numeral 18 refers to a solvent flow of colloidal suspension and numeral 19 refers to a meniscus fixed by colloidal particles.

In some embodiments, a small amount of colloid suspension is used to manufacture high quality two-dimensional or three-dimensional colloidal crystals throughout the large area within a short time. The present invention can be applied in manufacturing a bio device and a sensor, an informational storing medium, an optical device and a display device required for a uniform colloidal crystal throughout a large area.

In addition, the present invention provides a new coating technology for manufacturing a colloidal crystal and a thin film on a substrate.

Two-dimensional and/or three-dimensional colloidal crystals obtained from the present invention can be used as a lithography mask, a template for manufacturing a two-dimensional nano-array, a template for growing different colloidal crystals, a catalyst scaffold, a substrate for growing a cell and photonic bandgap crystals.

Hereinafter, the present invention will be described in detail with reference to the following embodiments and examples, which will be described for the purpose of describing the invention in detail and not for limiting the scope of the invention.

EXAMPLE 1

Manufacturing Colloidal Crystals in Accordance with Control of a Speed for Lifting the Rear Substrate A polystyrene colloidal particle made by emulsion polymerization was used as a high molecular particle and water was used as a solvent.

The polystyrene particle with 460 nm was dispersed into water to manufacture a polystyrene suspension with the concentration of 0.5%.

The polystyrene suspension of 50 μl was infused into a fine space between two glass substrates (11) (12) using micro pipettes. Then, warm air (13) was applied and the rear substrate (11) was lifted at the speed of 20 μm/s to manufacture a colloidal crystal. After 10 minutes passed, a colloidal crystal of a polystyrene particle with 460 nm thickness was obtained on the rear substrate. This was confirmed by an electron scanning microscope which showed that obtained colloidal crystal was a three-dimensional colloidal crystal consisting of three layers.

EXAMPLE 2

Figure 4:
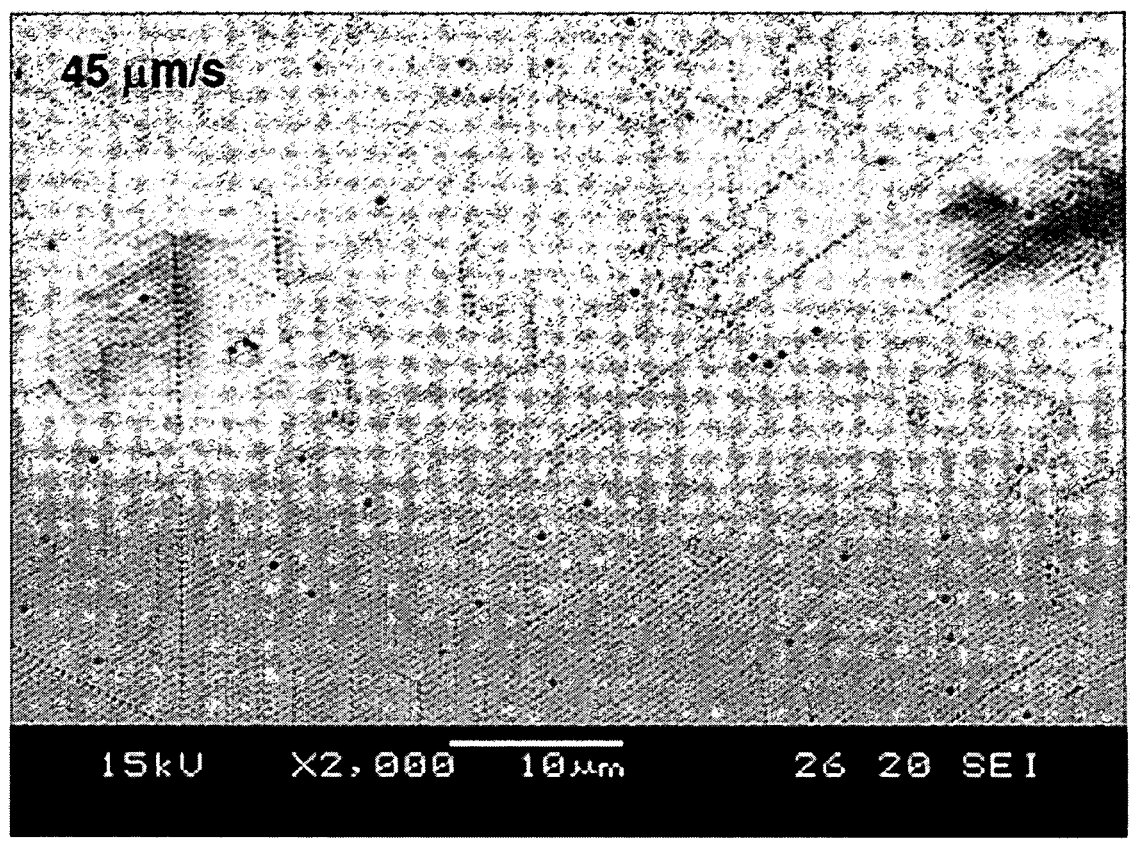
FIG. 4 is a photograph of an electron scanning microscope showing a two-dimensional colloidal crystal of a polystyrene particle with 460 nm according to the present invention (concentration: 0.5%, speed of lifting a rear substate: 45 μm/s).
Figure 5:
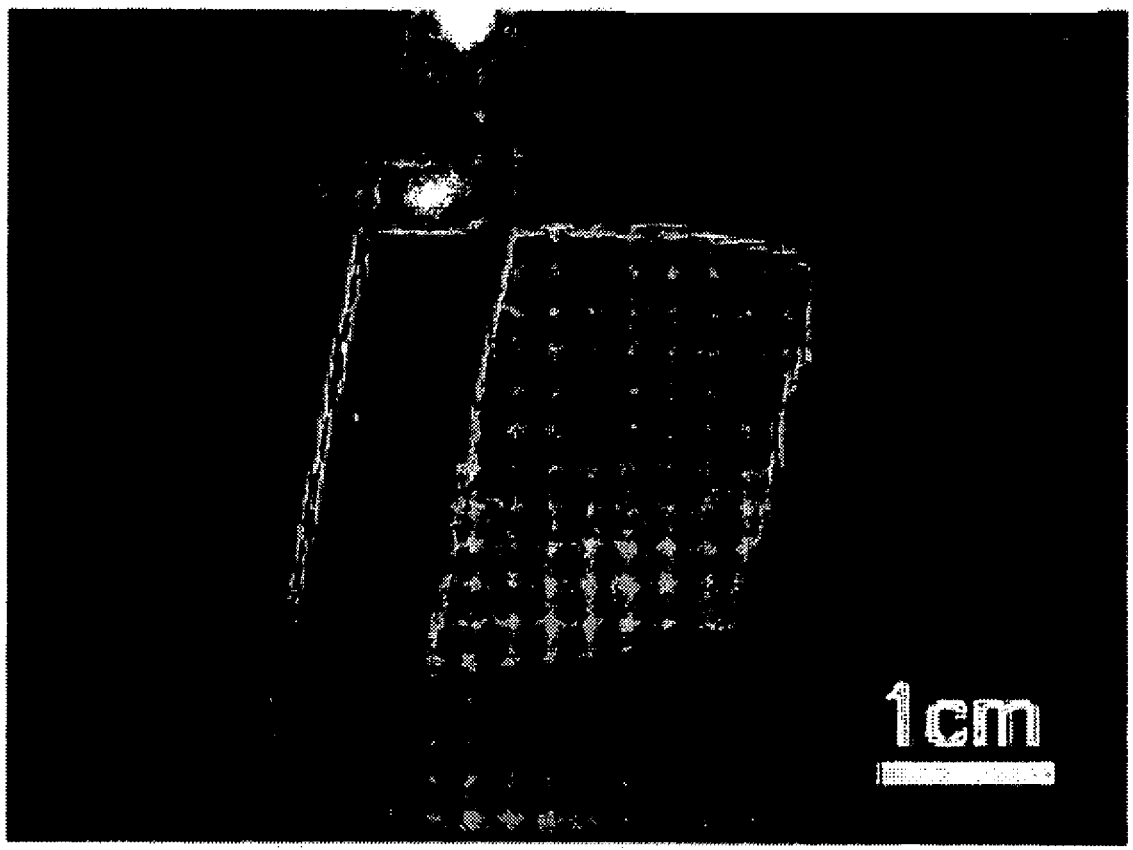
FIG. 5 is a portrait seal of a two-dimensional colloidal crystal specimen of a polystyrene particle with 460 nm according to the present invention (concentration: 0.5%, speed of lifting a rear substate: 45 μm/s).

Manufacturing Colloidal Crystals in Accordance with Control of Speed for Lifting the Rear Substrate The same method as in Example 1 was used to manufacture a colloidal crystal, except that the rear substrate was lifted at a speed of 45 μm/s. As was shown in the results observed by an electron scanning microscope and a digital camera in FIGS. 4 and 5, the obtained colloidal crystal was a high quality two-dimensional colloidal crystal consisting of one layer, which is uniformly formed throughout the entire substrate.

EXAMPLE 3

Figure 6:
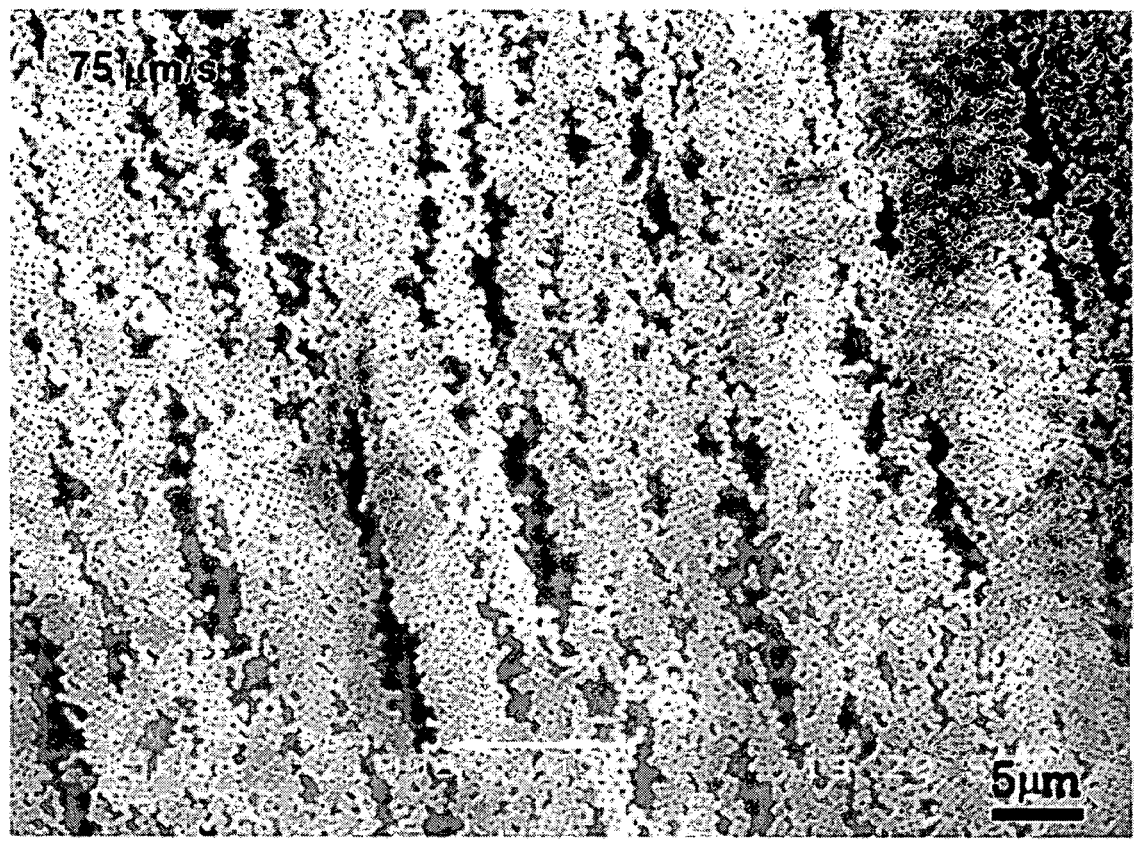
FIG. 6 is a photograph of an electron scanning microscope showing a two-dimensional colloidal crystal of a polystyrene particle with 460 nm according to the present invention (concentration: 0.5%, speed of lifting a rear substate: 75 μm/s).

Manufacturing Colloidal Crystals in Accordance with Control of a Speed for Lifting the Rear Substrate The same method as in Example 1 was used to manufacture a colloidal crystal, except that the rear substrate was lifted at a speed of 75 μm/s. As was shown in the results observed by an electron scanning microscope in FIG. 6, the obtained colloidal particles were arranged in a sparse structure with empty space.

EXAMPLE 4

Figure 7:
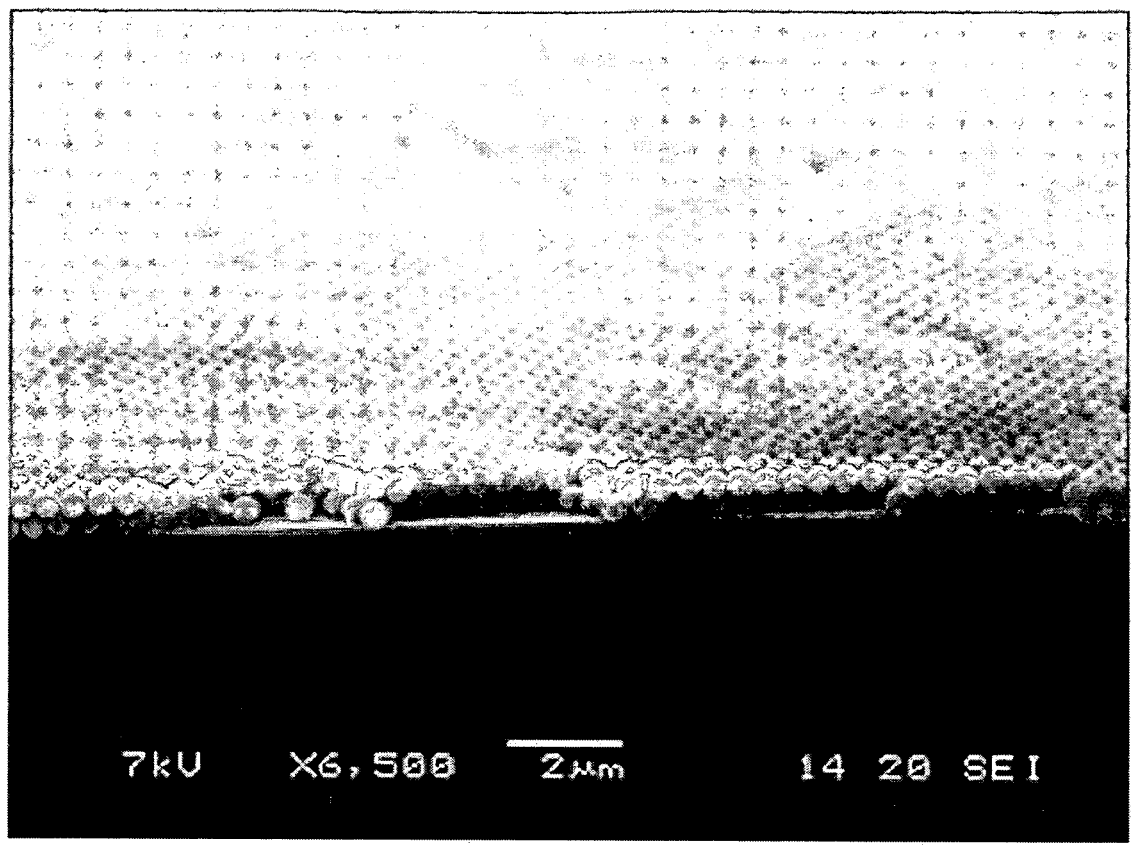
FIG. 7 is a photograph of an electron scanning microscope showing a three-dimensional colloidal crystal of a polystyrene particle with 460 nm according to the present invention (concentration: 1.0%, speed of lifting a rear substate: 45 μm/s).

Manufacturing Colloidal Crystals in Accordance with Control of the Concentration of Colloidal Suspension The same method as in Example 1 was used to manufacture a colloidal crystal, except that the concentration of colloidal suspension was increased by 1.0%. As was shown in the results observed by an electron scanning microscope in FIG. 7, the obtained colloidal crystal was a three-dimensional colloidal crystal with two layers.

EXAMPLE 5

Figure 8:
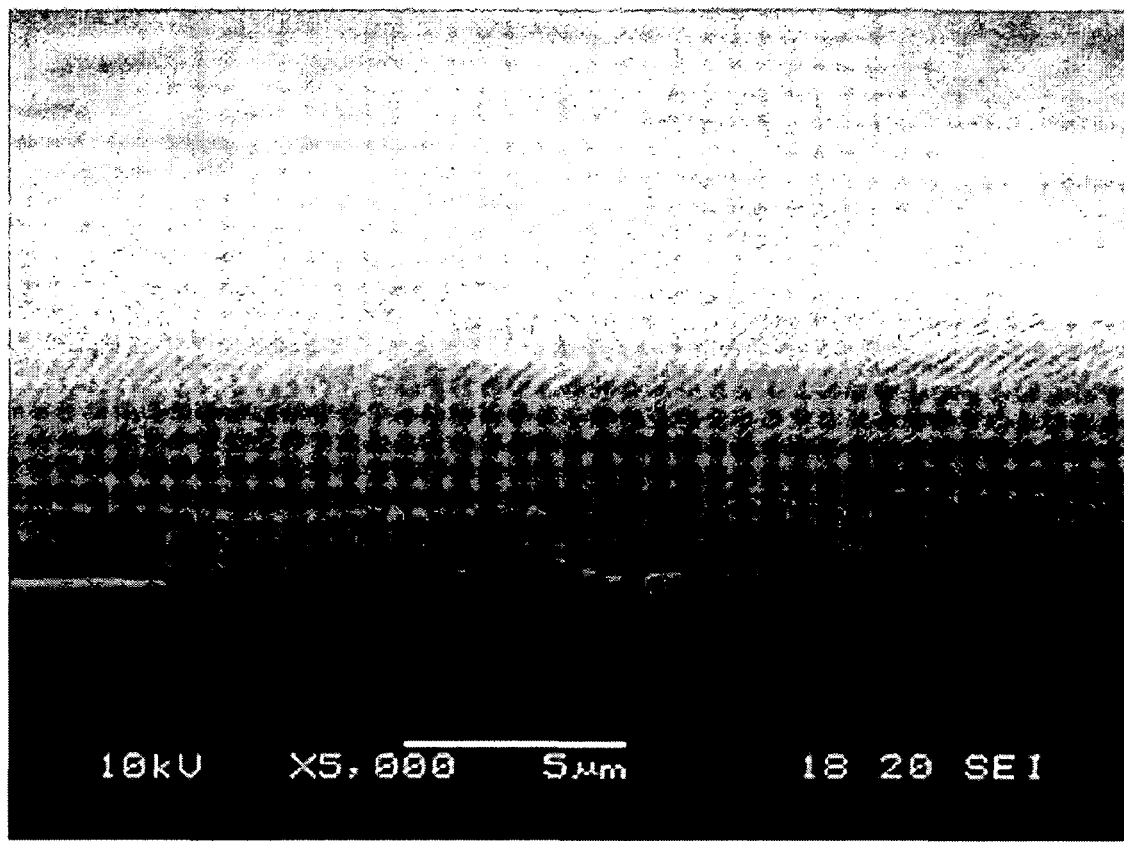
FIG. 8 is a photograph of an electron scanning microscope showing a three-dimensional colloidal crystal of a polystyrene particle with 460 nm according to the present invention (concentration: 2.0%, speed of lifting a rear substate: 45 μm/s).

Manufacturing Colloidal Crystals in Accordance with Control of the Concentration of Colloidal Suspension The same method as in Example 1 was used to manufacture a colloidal crystal, except that the concentration of colloidal suspension was increased by 2.0%. As was shown in the results observed by an electron scanning microscope in FIG. 8, the obtained colloidal crystal was a three-dimensional colloidal crystal with four layers.

EXAMPLE 6

Manufacturing a Two-Dimensional Colloidal Crystal in Accordance with the Size of a Colloidal Particle The same method as in Example 1 was used to manufacture a colloidal crystal, except that a polystyrene particle with the size of 600 nm was used for manufacturing colloidal suspension and the rear substrate was lifted at the speed of 40 μm/s.

Figure 9:
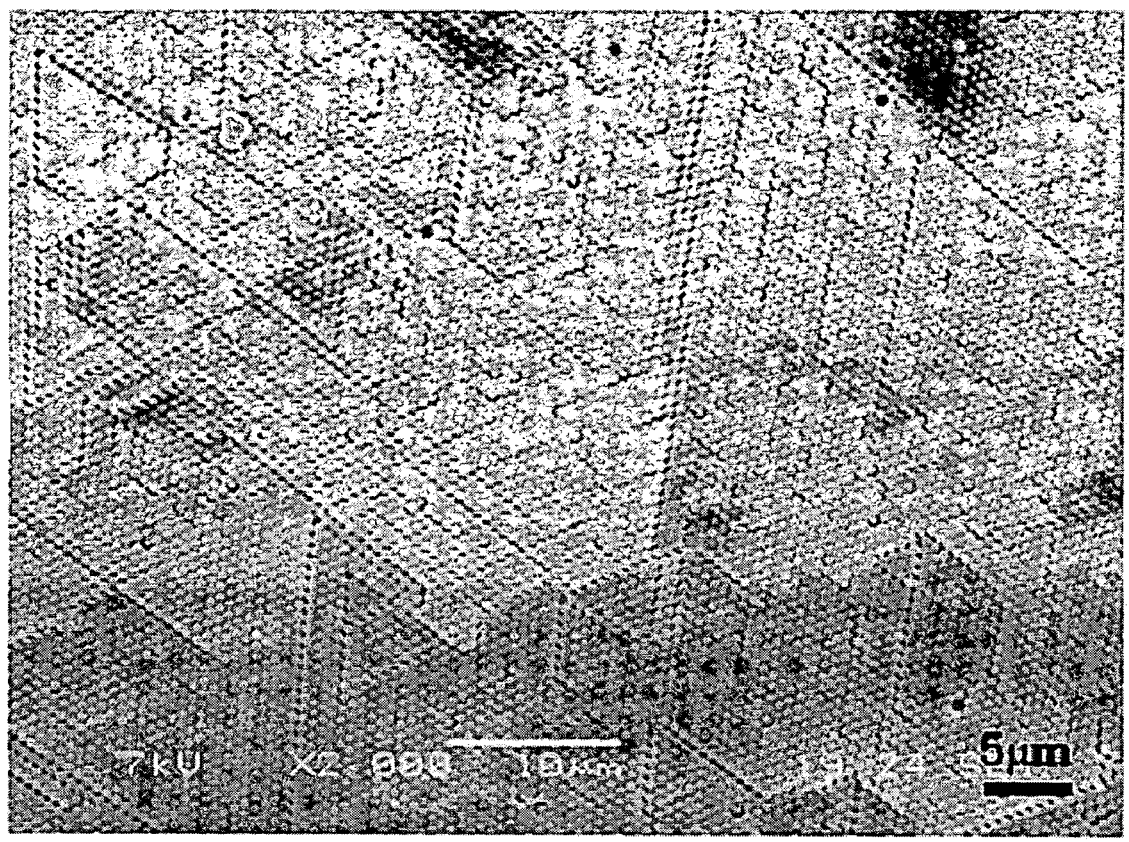
FIG. 9 is a photograph of an electron scanning microscope showing a two-dimensional colloidal crystal of a polystyrene particle with 600 nm according to the present invention (concentration: 0.5%, speed of lifting a rear substate: 40 μm/s).

As was shown in the results observed by an electron scanning microscope in FIG. 9, the manufactured colloidal crystal was a two-dimensional colloidal crystal with a single layer.

EXAMPLE 7

Figure 10:
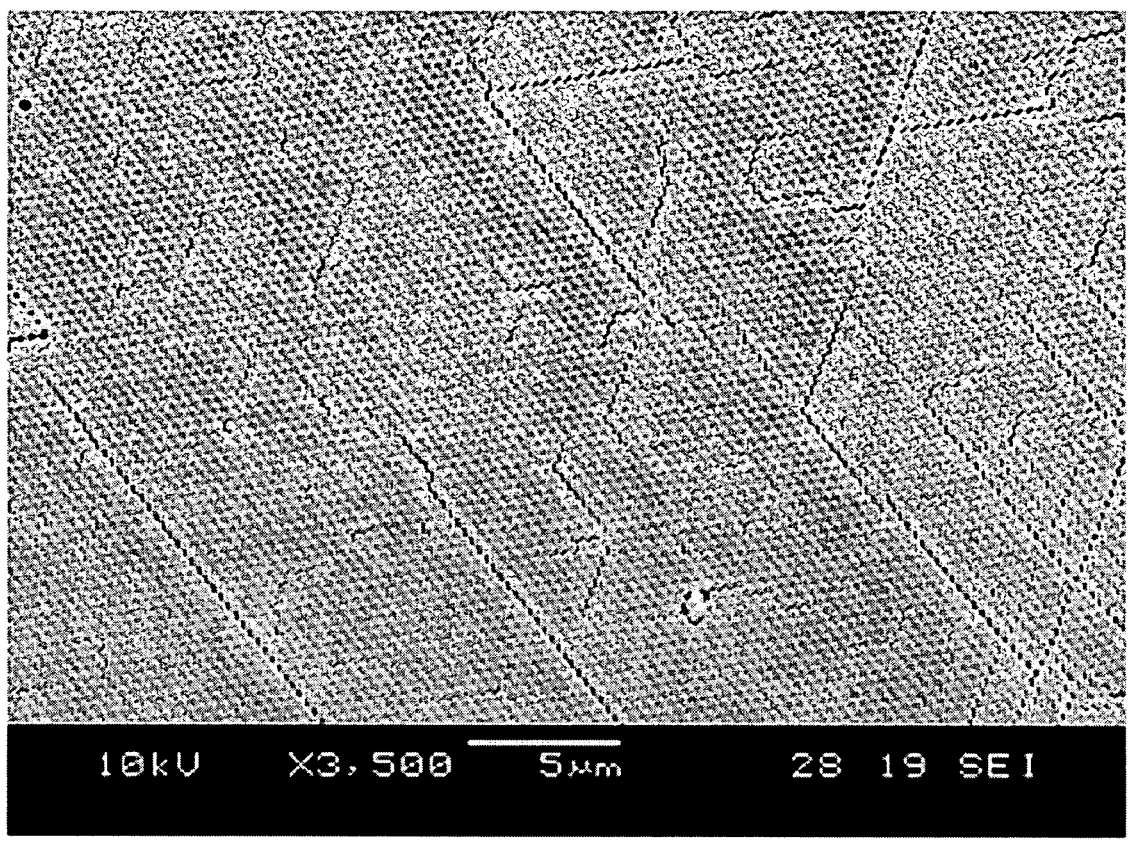
FIG. 10 is a photograph of an electron scanning microscope showing a two-dimensional colloidal crystal of a polystyrene particle with 360 nm according to the present invention (concentration: 0.5%, speed of lifting a rear substate: 45 μm/s).

Manufacturing a Two-Dimensional Colloidal Crystal in Accordance with the Size of a Colloidal Particle The same method as in Example 1 was used to manufacture a colloidal crystal, except that a polystyrene particle with the size of 360 nm was used for manufacturing colloidal suspension and the rear substrate was lifted at the speed of 45 μm/s. As was shown in the results observed by an electron scanning microscope in FIG. 10, the manufactured colloidal crystal was a two-dimensional colloidal crystal with a single layer.

EXAMPLE 8

Figure 11:
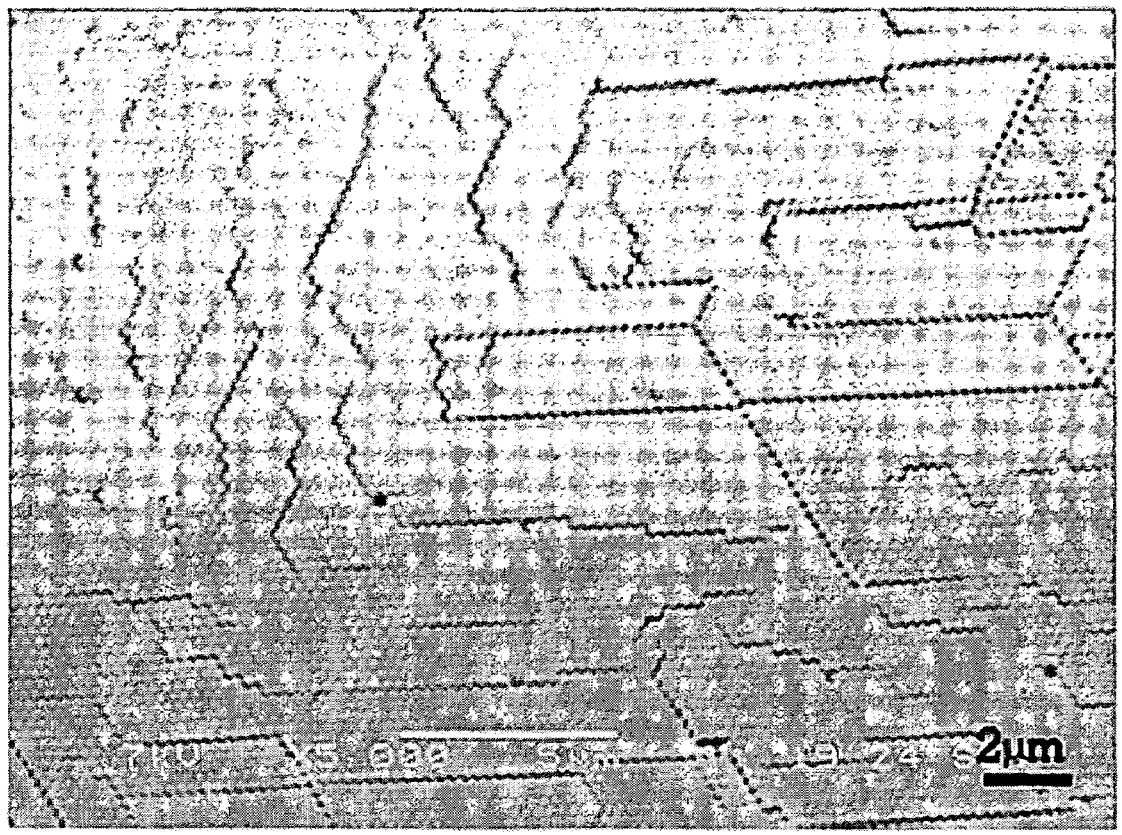
FIG. 11 is a photograph of an electron scanning microscope showing a two-dimensional colloidal crystal of a polystyrene particle with 260 nm according to the present invention (concentration: 0.5%, speed of lifting a rear substate: 55 μm/s).

Manufacturing a Two-Dimensional Colloidal Crystal in Accordance with the Size of a Colloidal Particle III The same method as in Example 1 was used to manufacture a colloidal crystal, except that a polystyrene particle with the size of 260 nm was used for manufacturing colloidal suspension and the rear substrate was lifted at the speed of 50 μm/s. As was shown in the results observed by an electron scanning microscope in FIG. 11, the manufactured colloidal crystal was a two-dimensional colloidal crystal with a single layer.

EXAMPLE 9

Manufacturing a Silica Colloidal Crystal

The same method as in Example 1 was used to manufacture a colloidal crystal, except that a silica particle with the size of 400 nm was used for manufacturing colloidal suspension.

EXAMPLE 10

Manufacturing a Three-Dimensional Colloidal Crystal with a Large Thickness

The same method as in Example 1 was used to manufacture a colloidal crystal, except that the concentration of the colloidal suspension was increased by 10%.

EXAMPLE 11

Manufacturing Binary Colloidal Crystals

A substrate with a two-dimensional colloidal crystal obtained by Example 2 was used as the rear substrate.

The 0.1% polystyrene suspension solution (50 ul) with the size of 230 nm was infused into a fine space between two substrates using a micropippet and the rear substrate is lifted at a speed of 45 μm/s while warm air is applied. These processes are reiterated several times.

Figure 12:
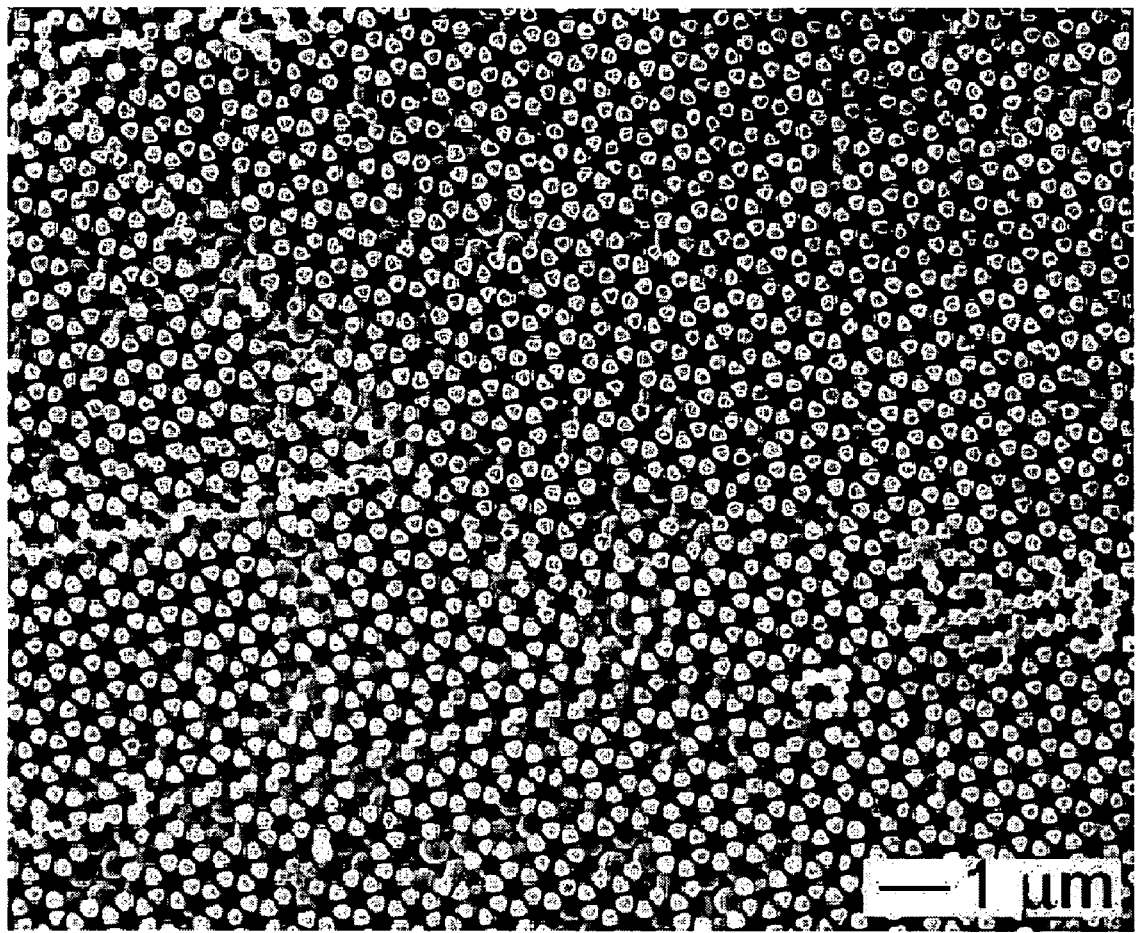
FIG. 12 is a photograph of an electron scanning microscope showing a binary colloidal crystal consisting of polystyrene particles with 230 nm and 460 nm according to the present invention.

It has been known that a binary colloidal crystal where small particles are arranged on a two-dimensional colloidal crystal with large particles in a two-dimensional crystal structure lattice as shown in FIG. 12 can be manufactured as the result of observation with a scanning electron microscope.

EXAMPLE 12

Comparison Example

Figure 13:
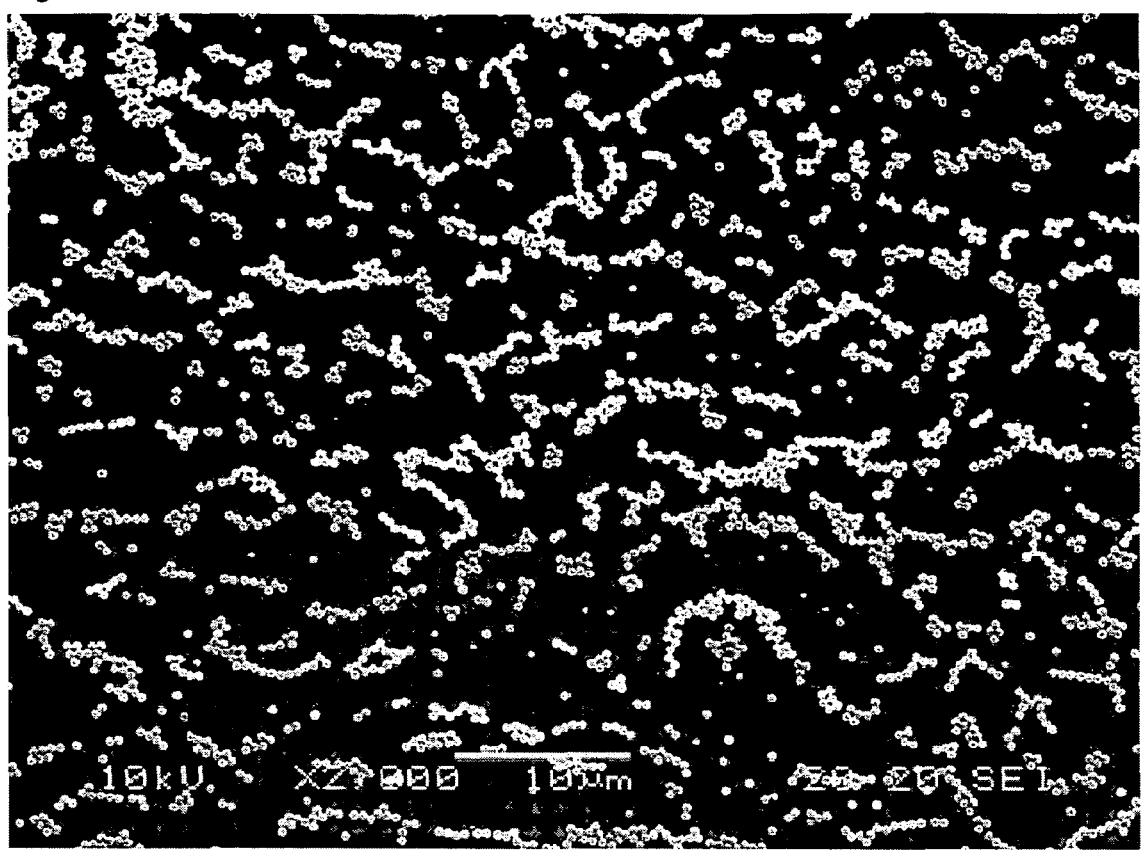
FIG. 13 is a photograph of an electron scanning microscope showing an arrangement of self-assembled colloidal particles in the state that a warm air is not applied as a comparison example when a colloidal crystal is manufactured in the present invention (concentration: 0.5%, speed of lifting a rear substate: 45 μm/s).

The same method as in Example 1 was used to manufacture a colloidal crystal, except that warm air was not applied as in Example 1. It was known from the results of observation by the electron scanning microscope that the evaporating speed of water was decreased because the warm air is not applied, therefore, colloidal particles could not be moved into a meniscus and colloidal crystals were not formed as seen in FIG. 13.

These examples illustrate possible methods of the present invention. While the invention has been particularly shown and described with reference to some embodiments thereof, it will be understood by those skilled in the art that they have been presented by way of example only, and not limitation, and various changes in form and details can be made therein without departing from the spirit and scope of the invention. Thus, the breadth and scope of the present invention should not be limited by any of the above-described exemplary embodiments, but should be defined only in accordance with the following claims and their equivalents.

All documents cited herein, including journal articles or abstracts, published or corresponding U.S. or foreign patent applications, issued or foreign patents, or any other documents, are each entirely incorporated by reference herein, including all data, tables, figures, and text presented in the cited documents.

What is claimed is:

1. A method of manufacturing a colloidal crystal, the method comprising:
    infusing a colloidal suspension comprising colloidal particles and a solvent in a fine space between two substrates;
    removing the solvent in the colloidal suspension and moving one of the substrates to form a meniscus in the fine space between two substrates; and
    self-assembling the colloidal particles by capillary action generated due to the removal of the solvent of the colloidal suspension in the meniscus to form a colloidal crystal on one of the substrates.

2. The method of claim 1, wherein at least one of the substrates is selected from the group consisting of a glass substrate, a silicon substrate, an aluminum substrate, a silica substrate, a gold substrate, a polystyrene substrate, a polyester substrate, a polydimethylsiloxane (PDMS) substrate, and a substrate including colloidal crystals.

3. The method of claim 1, wherein the substrate on which a colloidal crystal is formed can obtain multilayered colloidal crystals by applying a substrate including colloidal crystals formed from at least one selected from the group consisting of high molecular particles, metal particles, and inorganic particles.

4. The method of claim 1, wherein the fine space between the two substrates has a thickness of 10-100 μm.

5. The method of claim 1, wherein the colloidal suspension comprises at least one colloidal particle selected from the group consisting of a high molecular particle, inorganic particle, and metal particle.

6. The method of claim 1, wherein the colloidal particles of the colloidal suspension have a diameter of 0.01-10 μm.

7. The method of claim 1, wherein the solvent in the colloidal suspension is at least one selected from the group consisting of water, alcohol having 1-10 carbons, aliphatic solutizer, and aromatic solutizer.

8. The method of claim 1, wherein the concentration of the colloidal particle in the colloidal suspension is 0.1-20% (w/v).

9. The method of claim 1, wherein the moving substrate moves at a speed of 1-1000 μm/s.

10. The method of claim 1, wherein the solvent in the colloidal suspension is removed by (a) supplying the colloidal suspension with warm air to evaporate the solvent in the colloidal suspension, (b) supplying the colloidal suspension with high temperature vapors to evaporate the solvent in the colloidal suspension, (c) evaporating the solvent in the colloidal suspension using a heating equipment, or (d) putting equipment required for manufacturing a colloid including a substrate in a chamber wherein temperature and humidity are controlled.

11. The method of claim 1, further comprising filling in the pores of self-assembled colloid particles with at least one of semiconductor, metal, metal oxide, organic or organic derivatives.

12. The method of claim 5, wherein the high molecular particle is at least one selected from the group consisting of polystyrene, polymethylmethacrylate, polyacrylate, polyalphamethylstyrene, polyphenylmethacrylate, polydiphenylmethacrylate, polycyclohexylmethacrylate, styrene-acrylonitrile (SAN) copolymer and styrene-methylmethacrylate copolymer.

13. The method of claim 5, wherein the metal particle is at least one selected from the group consisting of gold, silver, aluminum, platinum, titanium, cadmium, and iron.

14. The method of claim 5, wherein the inorganic particle is at least one selected from the group consisting of $SiO_2$, $TiO_2$, $ZrO_2$, NiO, and $SnO_2$.

15. The method of claim 11, wherein the semiconductor is at least one selected from Si, CdS, CdSe, GaAs, GaAlAs, ZnS, and Ge.

16. The method of claim 11, wherein the metal is at least one selected from the group consisting of gold, silver, aluminum, platinum, titanium, cadmium, and iron.

17. The method of claim 11, wherein the metal oxide is at least one selected from the group consisting of aluminum oxide, iron oxide, zinc oxide, magnesium oxide, and antimony oxide.

18. The method of claim 11, wherein the organic or organic derivative is at least one selected from the group consisting of poly(para-phenylene vinylene), polythiophene, poly(para-phenylene), polyquinoline, polypyrrole, polyacetylene, polyfluorenes, polydimethylsiloxane (PDMS), and polyurethane.

* * * * *